United States Patent [19]
Swerlein

[11] Patent Number: 5,117,180
[45] Date of Patent: May 26, 1992

[54] METHOD AND APPARATUS FOR MEASURING RMS VALUES

[75] Inventor: Ronald L. Swerlein, Longmont, Colo.

[73] Assignee: Hewlett-Packard Company, Palo Alto, Calif.

[21] Appl. No.: 711,010

[22] Filed: Jun. 6, 1991

[51] Int. Cl.$^5$ .............................................. G01R 15/10
[52] U.S. Cl. .................... 324/132; 328/144; 364/483
[58] Field of Search ........... 324/132, 131, 119, 123 R; 328/144; 307/490; 364/483

[56] References Cited

U.S. PATENT DOCUMENTS

| | | | |
|---|---|---|---|
| 4,274,143 | 6/1981 | Brodie et al. | 364/483 |
| 4,346,346 | 8/1982 | Silberberg | 324/132 |

*Primary Examiner*—Ernest F. Karlsen
*Attorney, Agent, or Firm*—Edward L. Miller

[57] ABSTRACT

An AC RMS voltmeter two RMS converters of the type where the RMS value of the output is proportional to the RMS value of the input. The input signal is coupled to a first RMS converter through an input coupling network that includes a DC block. The first RMS converter is of the analog variety having good high frequency response but with a short time constant. Its output is allowed to track the input at low input frequencies. The output of the first RMS converter is digitized by an analog-to-digital converter at a rate high enough to capture any significant ripple coming out of the first RMS converter and operated upon by a second RMS converter implemented digitally by a microprocessor. The sampling rate of the A/D converter need not be high enough to operate at the highest frequencies applied to the voltmeter, since these are converted to DC by the first RMS converter. However, the time constant of the second RMS converter is selectable, and can be made long enough to measure ripple frequencies from the first RMS converter of just a few hertz, where the output of the first RMS converter exhibits significant tracking of the applied input. The first RMS converter may be said to convert the input voltage to a DC component and an AC (ripple) component. The second RMS converter combines these to a single DC component. The second RMS converter may include a pre-emphasis filter that compensates for the attenuation of applied frequencies by the DC block in the input coupling network. A third RMS converter is coupled to the output of the first RMS converter and is used to control the auto-ranging logic.

13 Claims, 7 Drawing Sheets

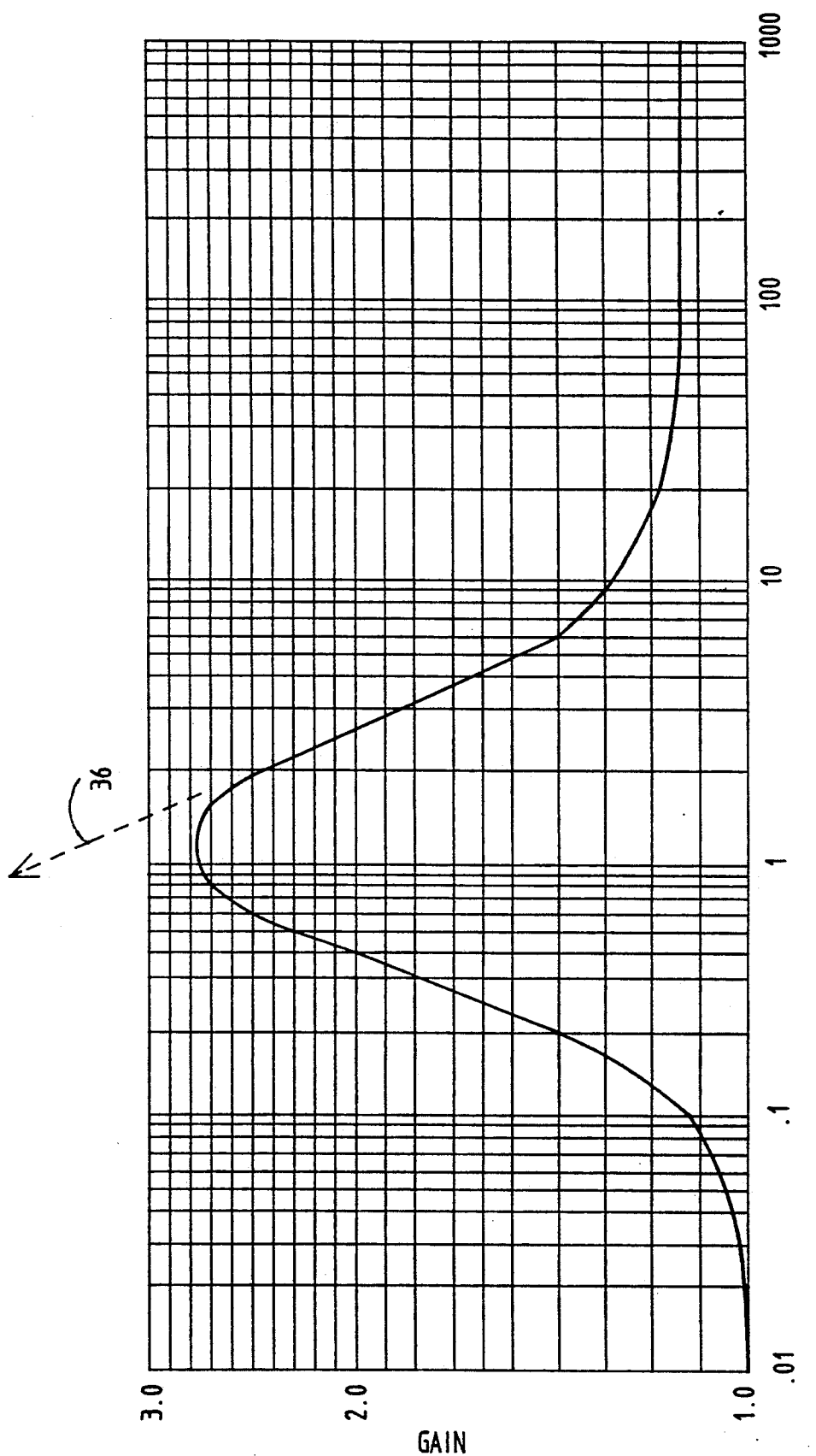

METHOD AND APPARATUS FOR MEASURING RMS VALUES

BACKGROUND OF THE INVENTION

It is generally appreciated by voltmeter users that the garden variety AC voltmeter which is "average responding but calibrated in RMS volts" gives correct indications only for sinusoids, and only then provided the input is a single frequency signal free of significant distortion. While these constraints can sometimes be met, they frequently can not be met or are simply ignored. Thus, on the one hand, commercially available DC voltmeters routinely measure one volt out to six or eight places; while on the other hand, the typical AC measurement made with an average responding voltmeter can't be trusted to more than four places. For this and other reasons there has been increasing interest in AC voltmeters that respond directly to the RMS value of the applied signal instead of to the average value.

The essential ingredient of an RMS meter is the RMS converter. One type of RMS converter produces a DC output voltage that is proportional to the RMS value of an applied input that is itself either DC or an AC signal of components above a certain frequency and below another. Thermal converters and analog logging circuits are frequently used as RMS converters. Techniques also are in use where the incoming waveform is periodically accurately sampled, digitized and the RMS value computed. The Hewlett-Packard 3458A is an example of this latter technique.

One might be tempted to say that the community of users for voltmeters expects the accuracy of AC measurements to improve commensurate with the ongoing improvements in DC measurement. This suggests an increased interest in RMS measurements, and indeed, many RMS converters are now on the market: the cost of RMS measurement is coming down and its typical accuracy is going up.

Nevertheless, the measurement of the true RMS voltage of a time varying signal is frequently more difficult than is ordinarily appreciated. Consider the following three aspects of RMS measurement.

The first of these aspects is selection of the time constant for RMS converter response. Consider the measurement of the RMS voltage of an arbitrary waveform. Suppose this particular waveform represents some kind of modulation that comes and goes. When there is no modulation we'd prefer to say that the RMS value of the modulation signal is zero. When the modulation is present it has some apparent value. Now suppose the modulation is continuously present thirty percent of the time and absent the remaining seventy percent of the time. Should it make a difference if the on/off times are thirty/seventy seconds as opposed to thirty/seventy milliseconds?. Or microseconds?. Most users would expect that it would make a difference, and indeed would want it to. It will make a difference if what is desired is the RMS value of the modulation when it is present (and excluding its absence), as compared to measuring the overall value for all modulation as an ongoing whole. Some users may desire a time constant (or averaging window) of several seconds, or even several tens of seconds, while others would be more conveniently served by a time constant of a few tenths of a second.

RMS stands for Root Mean Squared, and what our example illustrates is that the Mean or averaging part of the process has some way diminishing the contribution of past instances of signal values. There are at least three ways this can be done: exponential decay with a time constant (ala thermal converters); travelling averages; and, simple averages over a batch of readings taken within a specified time interval.

This diminution of the contribution of past events in the signal is desirable, if for no other reason, so that the reading on the voltmeter "comes up" (settles) within an "appropriate" length of time after application of the signal to the meter, and that it thus also similarly reflects changes in the applied value considered to be "steady state" changes.

To belabor the modulation signal example a bit further, it is clear that the considerations that surround the "duty cycle" issue of signal on versus signal off discussed above also attach themselves to what goes on while the signal is on. That is, to what extent is a short but extreme increase or decrease in the signal level to affect, and then persist in, the reading?. At root, the duty cycle issue and the response time issue are really the same thing, viewed from different perspectives.

Clearly then, a general purpose RMS meter ought to have a selectable response time. Such selectability is easier said than done, however. How does one change the (thermal) time constant of a thermal converter constructed of thermocouples isolated in an evacuated glass envelope?. It is true that the time constants in logging circuit type RMS converters can be changed. However, such switching (probably of premium grade capacitors exhibiting low dielectric absorption) is not without additional expense, and offers only preselected choices. The digitize and compute type of RMS converter would appear to have an advantage in this respect, since it employs digital filtering that does not make use of actual switches and actual capacitors.

The second aspect of interest is that of low frequency tracking. It is related to the notion of the time constant for response, in that at any point in time an RMS converter will have some particular (and therefore finite) time constant, even if it was selected from among a large number of possibilities. What low frequency tracking means is that for any given time constant, no matter how long, there will be input frequencies that the RMS converter treats as slowly changing steady state signals. That is, for those signals the output of the RMS converter will be a slowly changing output separable into a steady state (DC) component and a changing (AC) component. The lower the input frequency gets the smaller the DC output component gets and the larger the AC component gets. A thermal converter measuring 1 Hz would exhibit this behavior. At 0.1 Hz the situation is even worse, and would be rationalized by saying: "Well, it works great at DC, and this is just a varying DC input." It is important to recognize that this situation applies to all RMS converters, and not just to thermal converters. It happens because there must be a definite time constant.

The effects of tracking at high or medium frequencies are generally alleviated by filtering the output of the RMS converter. In principle such filtering introduces an error (as shown below), but in practice the error is relatively small and is considered a small price to pay to avoid an annoying jitter in the measurement.

Low frequency tracking can be a bothersome situation. On the one hand, if left unfiltered it produces an uncertainty or jitter in the displayed result, and although the variation in that result might warn the user of the uncertainty there is no guarantee that he will interpret the jitter correctly He might conclude that the signal is noisy. In any event, experience suggests that many users prefer stable readings, even at the expense of some inaccuracy. But on the other hand, heavy filtering of the output of the RMS converter ahead of the actual measurement circuit that is sufficient to conceal the presence of low frequency tracking will introduce significant errors in the result.

To appreciate why such filtering produces an error, consider the following case. Suppose a low frequency (say, one hertz) two volts peak-to-peak sine wave is applied to an RMS converter with a time constant that is relatively short compared to the period of th applied input, say a time constant of one twentieth or one fiftieth of a second. For the sake of analysis, further assume that the gain of the RMS converter is unity, so that for one volt RMS in we are to expect one volt RMS out. (In our example, the RMS input is 0.707 volts.) What does the output of this RMS converter look like under these conditions?.

First, the output closely resembles an absolute value function performed upon the input, much as the (unfiltered) output of a bridge rectifier in a power supply is related to a sinusoidal input. It is close to that, although not exactly. For whereas the input to the RMS converter passes through zero twice a second, the output of the RMS converter never falls completely to zero. For that to happen the input would have to remain at zero for some definite length of time, which would be on the order of five to ten time constants. Similarly, the output never quite rises to one volt, although it would get pretty close.

Now filter the output, say with an RC low-pass filter. The answer is, of course, between zero and one volt, and is probably not too far from 0.6366 volts, which is the familiar constant describing the relationship between a sine wave's peak value and its average rectified value. But any deviation from a value of 0.707 volts is an error. Now, the lower the frequency the more the converter's output resembles the output of a bridge rectifier, and the more the answer approaches the limiting value of 0.6366 volts. Clearly one can't simply filter the output of the RMS converter and restore its output to a DC value that is the same as the RMS value of the input. To do that, one must take the RMS value of the output, which requires combining the RMS value of the AC component with the DC component. It boils down to this: As tracking gets worse, more of the RMS converter's output is an AC component, but filtering removes the AC component as it extracts the DC component. Filtering removes it because the AC component must average to zero, and filtering is averaging. Therefore, the RMS value of the output of an RMS converter cannot be measured with an average responding voltmeter, any more than the RMS value of an arbitrary waveform can be measured with an average responding voltmeter to begin with.

The third aspect of interest is not difficult. There frequently is an input DC blocking capacitor ahead of the RMS converter. Its capacitive reactance at low frequencies combines with other impedances in the input circuit to produce a high pass filter. This limits the low frequency response of the RMS converter. Beyond a certain point larger capacitors are not an attractive solution to eliminating the effect of this filtering, and yet it is not always possible to dispense with the blocking capacitor.

Finally, consider the presence of an auto-ranging mechanism in the voltmeter. Typically, the decision about ranging is made using the output of the same RMS converter as is used to supply data to the display. This is generally appropriate in that the ranging decision is being based on an RMS value obtained in accordance with the same general rules as used to get the displayed answer, so that issues such as crest factor and low frequency tracking do not operate one way for the auto-ranging decision and another for the actual displayed reading. Such dissimilar operation could result in inappropriate range selection. However, when long time constants are involved the use of the same RMS converter for both functions can cause long setup times for selecting the proper range. It would be desirable if a separate RMS converter could be employed to steer the auto-ranging mechanism. This additional converter would be in all respects as similar as possible to the main RMS converter (to minimize the ill effects arising from dissimilar response) except that is has a somewhat shorter settling time. The idea is that the auto-ranging mechanism needs a far less accurate measurement, since the logic for auto-ranging incorporates some amount of hysteresis, anyway. The disadvantage of this arrangement is, of course, the additional cost of a whole extra RMS converter.

SUMMARY OF THE INVENTION

Low frequency tracking is not fatal. Although it is not commonly appreciated, it can be dealt with when the RMS converter is of the type where the RMS value of the output is proportional to the RMS value of the input. Some methods of RMS measurement incorporating thermal converters fit into this category, as do certain RMS converters of the logging circuit variety. What can be done is to separate the output of the RMS converter into its AC and DC components. The separated values are then measured and combined to produce the true RMS value. The AC component is measured with another RMS converter. The DC component can also be measured by that other RMS converter.

Why not simply use a "better" RMS converter to begin with?. The answer is that it is both difficult and expensive. Such an RMS converter would have good high frequency response and selectable time constants. As will be shown in a subsequent section, it suffices to leave the time constant of the first RMS converter at a minimum value, allow it to track low frequencies, and then measure and combine the AC and DC output components of the first RMS converter with another RMS converter having an adjustable time constant. In this way the first RMS converter can have good high frequency response and a fixed but short time constant, while the second RMS converter can have selectable time constants without good high frequency response. (After all, the only AC it sees is the low frequency ripple from the first RMS converter.)

An analog RMS converter is an ideal choice for the first RMS converter, since for the cost it can provide the best high frequency operation, and do so with reasonably good accuracy. The sampling/digital filter type of RMS converter is ideal for the second RMS converter, since it can provide good accuracy at modest cost for the low frequencies that it must deal with, and since the time constant of the digital filter can be easily changed as needed.

This structure of two RMS converters can be further refined to correct, down to any selected frequency, the effects of capacitive coupling within the overall RMS converter. This is done by adjusting the nature of the digital filtering in the second RMS converter, so that it emphasizes the lower frequencies. This compensation is very nearly exact down to some selected cutoff frequency, and may be used regardless of whether the capacitive coupling produces either single or multi-pole rolloff of the input signal.

Once the second RMS converter has been chosen to be of the sampling and digital filtering variety, it is cost effective to incorporate a microprocessor to do the squaring, digital filtering and root taking. This provides a particularly harmonious way of implementing a "separate" third RMS converter to control the auto-ranging mechanism. The same sampler is used for both the second and third RMS converters; the microprocessor runs separate instances of different digital filters and their surrounding arithmetic processes.

The methods and apparatus described herein are not limited to RMS voltmeters, but may also be applied to improve the operation of any measurement device (a "meter") that is responsive to the RMS value of some time variant quantity (to produce an "RMS meter"). In particular, it can also be used in the measurement of current. Depending upon the nature of the application (i.e., what kind of "meter"), it may not be necessary for the second and third converters to be full RMS converters. It may be desirable that those converters dispense with the squaring and square root, and merely filter. Such a structure may be desirable in the case, such as in an RF power meter, where some transducer produces a signal that is already proportional to power, and can simply be averaged directly. As a further variation, if one did measure power, say with a thermistor mount, one could average the resulting voltage signal that is already proportional to power (thereby accounting for variations produced by a modulation envelope) and then take the square root to produce the RMS RF voltage.

BRIEF DESCRIPTION OF THE DRAWINGS

FIG. 7 is a graph showing as a function of frequency the gain of a pre-emphasis filter used in conjunction with compensation of the DC blocking error of FIG. 6.

DESCRIPTION OF THE PREFERRED EMBODIMENT

Figure 1:
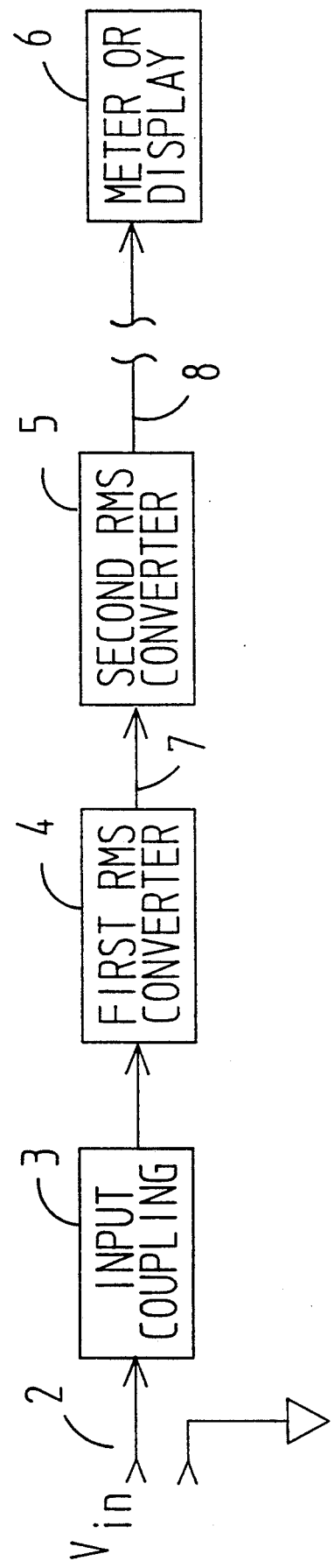
FIG. 1 is a simplified partial block diagram of a circuit for RMS measurement constructed in accordance with certain principles of the invention.

Refer now to FIG. 1, wherein is shown a simplified partial block diagram of a preferred circuit 1 for RMS measurement. The signal $V_{in}$ to be measured is applied to a pair of input terminals 2. An input coupling network 3 couples the signal to be measured to a first RMS converter 4. The input coupling network 3 may be either AC or DC coupled. Note that if it is AC coupled it operates as a high-pass filter, which if left uncompensated may undesirably limit the low frequency response of the measurement circuit 1. The input coupling network 3 also performs, in a manner well known in the art, the functions of attenuation of large input signals and amplification of small input signals. In this way the first RMS converter 4 need not itself operate over the entire dynamic range of millivolts to kilovolts that the voltmeter as whole is expected to operate over.

It is desirable that the first RMS converter 4 be of the type where the RMS value of its output is proportional (or nearly so) to the RMS value of the applied input $V_{in}$. The first RMS converter 4 has the primary task of converting the applied input signal $V_{in}$ to a DC output signal 7 whose magnitude is proportional to the RMS value of that applied input signal. Above certain frequencies the output 7 is strictly (or very nearly strictly) DC with no AC component. But at lower frequencies, or for input frequencies whose amplitude is varying at a rate less than some rate, the output 7 of first RMS converter 4 includes both AC and DC components. For purposes of analysis, then, we shall simply say that the AC component is zero (or insignificant) for input signals of sufficiently high frequency and of steady amplitude, and also for input signals of sufficiently high frequency and of varying amplitude, where the rate of amplitude variation is sufficiently high.

The first RMS converter 4 must have frequency response high enough to match the highest significant frequency components in the applied signal to be measured. There is no escape from that elementary requirement. Logging circuits, thermal converters, and even thermistor and bolometer mounts are examples of techniques that may be used as the first RMS converter 4. In one particular product incorporating the invention (the HP Model 34401A Multimeter, from the Hewlett-Packard Co. of Palo Alto, Calif.) the first RMS converter 4 is an AD6-37 from Analog Devices Corp. of Norwood, Mass.

While a variety of factors, such as cost, accuracy, sensitivity to the applied signal, sensitivity to changes in ambient temperature, etc., are also of interest besides mere frequency response in selecting the first RMS converter 4, one thing that need not be of concern is its time constant for response, provided only that it is short enough for those measurement situations where a short time constant for response is required. That is, the first RMS converter 4 can be allowed to produce an AC component that tracks the applied input signal.

The output 7 of the first RMS converter 4 is DC coupled to the input of a second RMS converter 5. The second RMS converter 5 has a time constant for response that is preferably selectable, so that the overall time constant for response for the circuit 1 as a whole can be nearly as short as that of the first RMS convert 4 when short time constants are required, and as long as needed when long time constants are appropriate.

The second RMS converter 5 produces a "DC output" 8 proportional to the RMS value of the applied input, but need not have, in principle, frequency response much above the highest frequency for which there is measurable ripple from the first RMS converter 4. To this end, it is preferred that the second RMS converter 5 be a sampling analog to digital converter whose stream of output data is arithmetically converted to an RMS value and operated upon by a digital filter.

Subsequently, the output 8 of the second RMS converter 5 is applied to a meter or digital display mechanism 6.

Various implementations of the embodiment of FIG. 1 are certainly possible, and it is conceivable that the second RMS converter 5 could be an analog RMS conversion mechanism followed either by an analog filter or by an analog to digital converter coupled to a digital filter.

Figure 2:
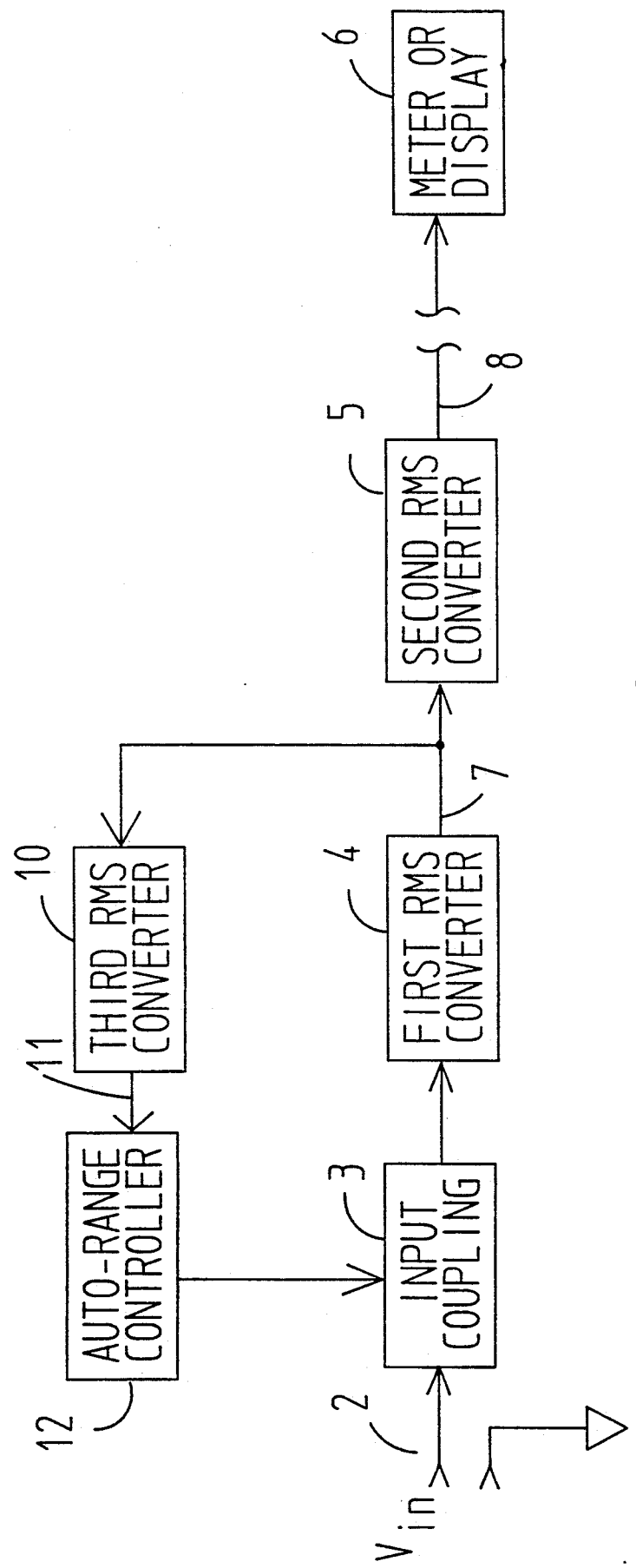
FIG. 2 is a simplified partial block diagram of a circuit for an auto-ranging RMS voltmeter.

Now consider FIG. 2, wherein is shown a simplified block diagram 9 of an auto-ranging RMS voltmeter. The block diagram 9 of FIG. 2 is similar to block diagram 1 of FIG. 1, and corresponding elements have identical reference numerals. What is additional in FIG. 2 is a third RMS converter 10 also receiving the output signal 7 from the first RMS converter 4. It is preferred that the third RMS converter 10 be equivalent to the second RMS converter 5, except that its settling time constant is perhaps one half or a fourth that of the second RMS converter 5.

The output 11 of the third RMS converter 10 is coupled to an auto-range controller 12, which is in turn coupled to the input coupling network 3. It will be recalled that the ranging functions of input attenuation and amplification were attributed to the input coupling network 3. In a manner well known in the art the auto-range controller 12 responds to the output 11 from the third RMS converter 10 by selecting the appropriate attenuation or amplification function within input coupling network 3.

Figure 3:
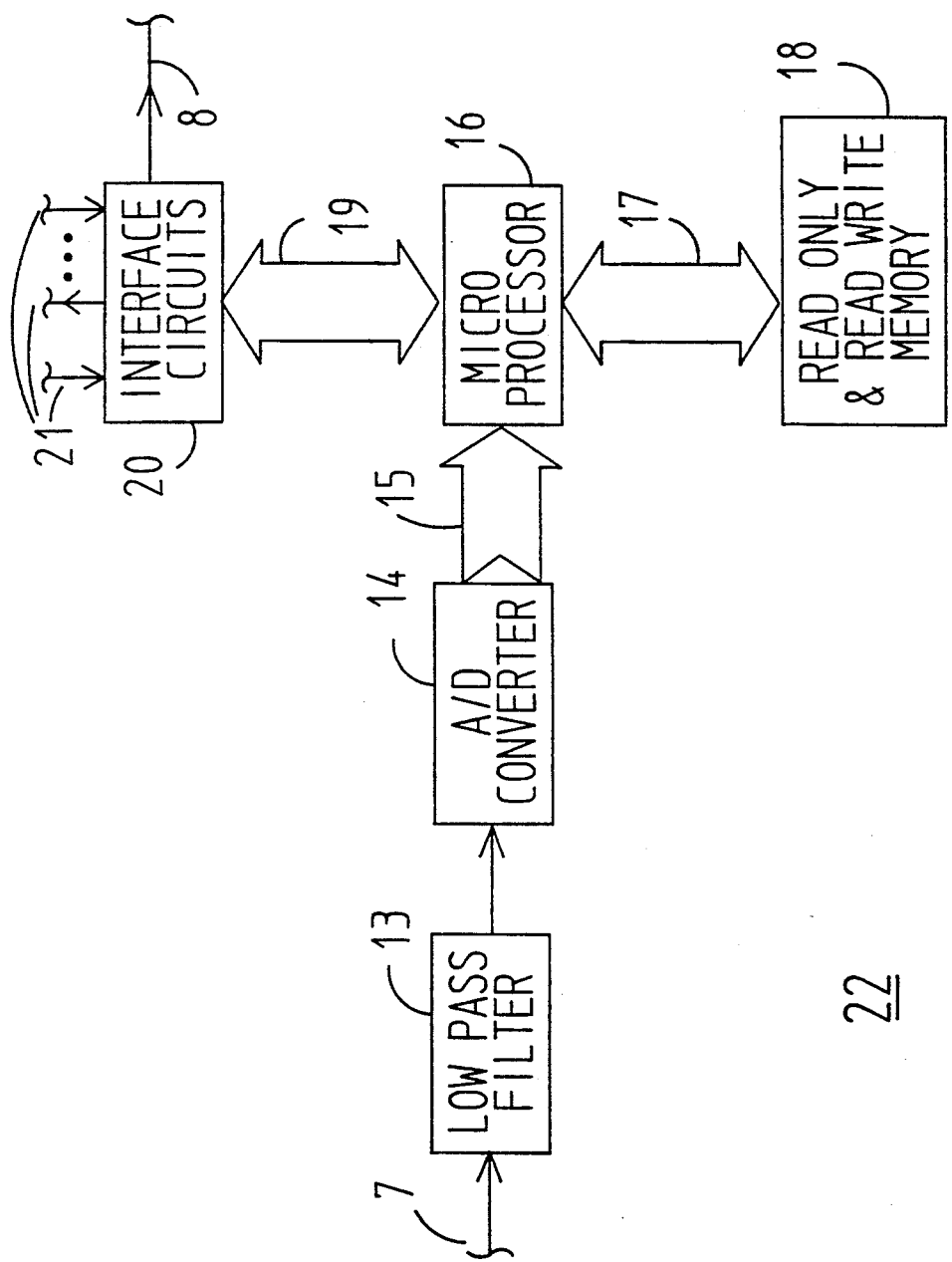
FIG. 3 is a simplified partial block diagram of a circuit for an auto-ranging RMS voltmeter as in FIG. 2 but constructed in accordance with certain principles of the invention.

Refer now to FIG. 3, wherein is shown a simplified hardware block diagram 22 for implementing with a processor the second and third RMS converter portions 5 and 10 of the block diagram 9 in FIG. 2.

An analog low pass filter 13 is coupled to the output 7 of the first RMS converter 4. The function of filter 13 is to prevent aliasing by the analog to digital conversion described next. In some embodiments filter 13 could be eliminated if the sampling rate of that analog to digital conversion were at least twice the highest significant ripple frequency appearing on output 7 from the first RMS converter 4.

The (analog) output of the filter 13 is coupled to an A/D (analog to digital) converter 14. A/D converter 14 is preferably of either the integrating or sigma-delta type with a sampling rate in the vicinity of one thousand samples per second and a resolution of seventeen bits of magnitude and a sign bit. If filter 13 is properly chosen it may be desirable to allow the sampling rate to be reduced to five hundred samples per second. The output 15 of the A/D converter 14 is a sequence of (parallel) digital values coupled to a microprocessor 16.

Microprocessor 16 is coupled by appropriate busses and control lines 17 and 19 to respective memory 18 and interface circuits 20. Memory 18 includes both read-only portions (ROM) and read/write portions (RAM), although these are not shown separately. It will be understood that the ROM portions retain various programs that the microprocessor 16 executes to perform its functions of RMS conversion and digital filtering. Interface circuits 20 ar simply indicated here in a general way, and are used by the microprocessor 16 to determine (via lines 21) the status of conditions within the voltmeter and to effect changes. Although the particulars of the device chosen to be microprocessor 16 will influence the nature of the interface circuits 20, "memory mapped I/O" is an example of how interface circuits 20 may be implemented. In the technique of memory mapped I/O individual latches or registers respond on the one hand to the microprocessor as addressable memory. On the other hand their actual memory cell elements are not "buried" inside a memory IC, but are accessible (as indicated by lines 21) by the circuitry being interfaced to the microprocessor 16.

As shown in the figure, line 8 that couples output data to the display is coupled to the microprocessor 16 via interface circuits 20. This is matter of choice, and it is possible that a separate mechanism couples the display (as well as perhaps a more general data/control port such as IEE 488 or RS 232) to the microprocessor 16. Similarly, the output of the analog to digital converter 13 in FIG. 3 is shown as proceeding directly to the microprocessor 16. It is to be understood that an intervening interface circuit (not separately shown, and which also could possibly be circuits 20) will be employed if required by the type of microprocessor in use.

It will be observed that FIG. 3 is a hardware architecture depicting a system incorporating a microprocessor. Although truthful, it is an incomplete indication of how in particular the actions of the second RMS converter 5 and third RMS converter 10 are accomplished. Of course, the situation is that the analog to digital converter 14 cooperates with programming executed by the microprocessor 16 to accomplish these functions. A functional equivalent of this cooperation is shown in FIG. 4.

Figure 4:
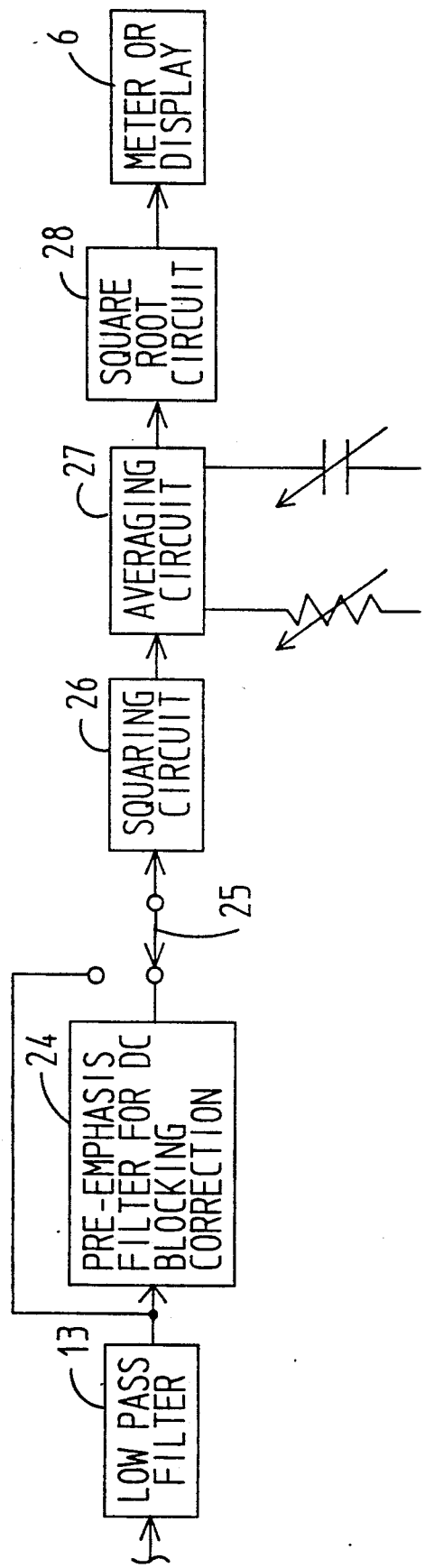
FIG. 4 is an equivalent hardware block diagram of the hardware and software system of the RMS voltmeter shown in FIG. 3.

Refer now to FIG. 4, which is an equivalent block diagram 23 of hardware that might be used to accomplish the function of second RMS converter 5 According to the block diagram 23 the analog output of low pass filter 13 is coupled to a pre-emphasis filter 24 which corrects for the effects of a DC blocking capacitor in the input coupling network 3. Pre-emphasis filter 24 has unity gain at DC, with gain rising to some particular value at the lowest frequency $F_1$ at which correction is to occur. (Correction does not occur in the range from DC to $F_1$.) At frequencies above that lowest frequency $F_1$ the gain steadily decreases until a frequency $F_2$ is reached where, after which, some essentially constant gain greater than unity is maintained. It is in the region $F_1 <= F_{in} <= F_2$ that the effects of DC blocking are compensated. Above $F_2$ compensation is, in principle, still possible, but its amount is negligible since there is no real need for it.

Pre-emphasis filter 24 may be included in the signal path or not, as determined by the position of switch 25. The idea here is that there are times when the DC blocking correction is known to be unnecessary, or, perhaps even undesirable. As a side effect, the DC blocking correction feature increases settling time somewhat. Yet there are measurement situations where the lowest frequency measurable by the voltmeter is well above that where the DC blocking capacitor produces an error needing correction. Hence the desirability of switch 25, so that the pre-emphasis filter 24 can be excluded from the signal path when needed. The full particulars of DC blocking correction with the pre-emphasis filter 24 will be separately discussed in a later section.

The next element in the path of block diagram 23 is a squaring circuit 26. Its output is the square of its input. This corresponds to the "S" ("squared") in "RMS."

The output of squaring circuit 26 is coupled to an averaging circuit 27 incorporating adjustable time constants. Its output is a selected type of average of its input. This corresponds to the "M" ("mean") in "RMS."

The next element in the path of block diagram 23 is a square root circuit 28. Its output is the square root of its input. This corresponds to the "R" ("root") in "RMS."

Taken collectively as a signal path, elements 26, 27 and 28 comprise an RMS detector. As shown in FIG. 4, the output of this RMS detector is coupled to the meter or display circuit 6.

Before leaving FIG. 4 the following points should be noted:

First, FIG. 4 corresponds to FIG. 1 in that elements 26, 27 and 28 comprise second RMS converter 5. It will be understood that another version of FIG. 4 is readily envisioned, wherein a second instance of elements 26', 27' and 28' comprise the third RMS converter 10 of FIG. 2. Preferably, this second instance would be fed from the output of switch 25, and in parallel with the input to squaring circuit 26. In this way both second RMS converter 5 and third RMS converter 10 receive identical inputs.

Second, in the preferred embodiment there are not separate hardware elements that correspond individually to elements 24, 25, 26, 26', 27, 27', 28 and 28'. Instead, there is, as shown in FIG. 3, A/D converter 14 and microprocessor 16. The difference is found, of course, in the programming executed by the microprocessor 16.

Third, certain sections of the programming executed by the microprocessor 16 do correspond individually to those elements. It is to the nature of that programming to which we now turn our attention.

Here is a pseudo-code listing of portion of some controlling software useful in an RMS voltmeter constructed in accordance with the invention:

```
1 (ASSORTED INITIALIZATION UPON STARTING AC VOLTS)
2 X=A NEW READING;
3 X=X−OFFSET; !OFFSET IS A CALIBRATION CONSTANT
4 IF FILTER_SPEED=SLOW THEN !PRECHARGE CORRECTION FILTER
5     RDG=RDG1=RDG2=NEWX=NEWX1=NEWX2=X;
6 END IF;
7     OUTA=OUTB=OUTC=OUTD=OUTE=OUTF=OUTG=OUTA1=OUTB1=OUTC1=OUTD1=OUTE1=OUTF1=OUTG1=X1=Y1=X^2;   !THAT PRECHARGES THE MEASUREMENT AND AUTO-RANGE FILTERS
8 WHILE IN A GIVEN RANGE
9 X=A NEW READING; !1000 TIMES A SECOND
10 Y=X=X−OFFSET; !OFFSET IS A CALIBRATION CONSTANT
11 IF FILTER_SPEED=SLOW THEN !APPLY DC BLOCKING CORRECTION
12 RDG=X;
13 NEWX=A0* RDG+A1* RDG1+A2 * RDG2 −B1 * NEWX1−B2 * NEWX2;
14 RDG2=RDG1;
15 RDG1=RDG;
16 NEWX2=NEWX1;
17 NEWX1=NEWX;
18 X=NEWX;
19 END IF;
20 X=X^2;
21 OUTA=N_MEA * (X+X1)−D_MEA * OUTA1;
22 OUTB=N_MEA * (OUTA+OUTA1)−D_MEA * OUTB1;
23 OUTC=N_MEA * (OUTB+OUTB1)−D_MEA * OUTC1;
24 OUTD=N_MEA * (OUTC+OUTC1)−D_MEA * OUTD1;
25 X1=X;
26 OUTA1=OUTA;
27 OUTB1=OUTB;
28 OUTC1=OUTC;
29 OUTD1=OUTD;
30 ROOT=SQR (OUTD);
31 DISPLAY (ROOT);
32 Y=Y^2;
33 OUTE=N_ARNG * (Y+Y1)−D_ARNG * OUTE1;
34 OUTF=N_ARNG * (OUTE+OUTE1)−D_ARNG * OUTF1;
35 OUTG=N_ARNG * (OUTF+OUTF1)−D_ARNG * OUTG1;
36 Y1=Y;
37 UTE1=OUTE;
38 OUTF1=OUTF;
39 OUTG1=OUTG;
40 PILOT_VALUE=SQR (OUTG);
41 CALL AUTO_RANGE (PILOT_VALUE);
42 END WHILE;
43 XXX;
XX END.
```

The pseudo-code shown above includes DC blocking correction, the second RMS converter 5 as well as the third RMS converter 10. As a place to begin, assume that no DC blocking correction is desired, so that the IF statements at lines 4 and 11 steer around lines 5 and 12-18, respectively. Making those assumptions, the following is a discussion of the implementations of the second RMS converter 5 and the third RMS converter 10.

Line 2 takes an initial reading from A/D converter 14, which is then used by line 7 to pre-charge the measurement (digital) filter corresponding to the averaging circuit 27 of FIG. 4, as well as the corresponding digital filter (not shown) in the third RMS converter 10 of FIG. 2. The pre-charging of line 7 reduces initial settling time for those RMS converters 5 and 10.

Lines 8-42 are a loop that is executed continuously as long as there is no change in the range in use. Three major activities occur in the loop. The first of these is the compensation for DC blocking (pre-emphasis filter 24), the second is the RMS conversion for the second RMS converter 5, and the third is the RMS conversion for the third RMS converter 10.

Line 9 obtains a new reading X from the A/D converter 14. In the preferred embodiment these new readings are available at a rate of at least one thousand per second. Line 10 applies correction for known offsets.

According to our assumptions lines 11 through 19 are skipped (no DC blocking compensation).

Turning now to the second RMS converter, line 20 squares the new reading. This corresponds to squaring circuit 26 in FIG. 4.

Lines 21-29 are a digital filter whose input is X (which by this time contains the squared input value) and whose output is OUTD. Lines 22-29 correspond to the averaging circuit 27 of FIG. 4.

Line 30 takes the square root of the filter output, and thus corresponds to square root circuit 28 of FIG. 4.

Line 31 displays the square root, and thus actuates the meter or display circuit 6.

Lines 32-41 of the pseudo code listing above are the third RMS converter 10. The first thing it does it to square its own copy (Y) of the latest reading (corrected for offset but not compensated for DC blocking error) obtained in lines 9 and 10. The squared values in Y is filtered, with the output value appearing in the variable OUTG. The desired RMS value is obtained by taking the square root of OUTG; this is saved in PILOT_VALUE. Line 41 is a call to a procedure AUTO_RANGE that uses PILOT_VALUE to decide if the range needs to be changed or not. If no change is needed the WHILE loop of lines 8-42 continues. If the range needs to be changed the WHILE loop is thwarted and the range changed. Following the range change the WHILE loop is re-entered through lines 1-7.

The digital filter shown at lines 21-29 above is itself conventional, and may be viewed as a four pole filter whose cascaded sections are labelled A, B, C and D. The filter at lines 32-41 is similar, except that it has but three sections. They are labelled E, F and G. N_MEA and D_MEA are constants whose values are chosen in accordance with the value selected for FILTER_SPEED. TABLE I below sets out the relationship. N_MEA and D_MEA represent a numerator and a denominator used in the (MEAsurement) digital filter for the calculation of the measured value. They are similar in function to values N_ARNG and D_ARNG, also in TABLE I, for the (AutoRaNGe) digital filter used in the third RMS converter 10 of FIG. 2. The numerator and denominator values used in the measurement and autorange digital filters determine the cutoff frequency of those filters. Those values are also shown in TABLE I.

The following relationship needs to hold for the digital filters to have unity gain at DC:

$$2 * \text{N\_MEA} - \text{D\_MEA} = 1 \quad (1)$$

$$2 * \text{N\_ARNG} - \text{D\_ARNG} = 1 \quad (2)$$

The following notation applies to the digital filters. The four stages of the filter for the second RMS converter are called A, B, C and D, and are cascaded in that order. The initial input to the A stage is X; the output of the A stage is OUTA. OUTA1 is the previous output from the A stage, and is the input to the B stage. OUTB is the output of the B stage, whose previous output is OUTB1, etc. The filter for the third RMS converter has three stages E, F and G. A similar notation applies for the inputs, outputs and previous values for that filter.

The code is arranged that copies of the measurement filter and the autorange filter are executed in alternation. The microprocessor is fast enough that reading rate of one thousand readings per second can be maintained.

TABLE I

| FILTER_SPEED | f0 | N_MEA | D_MEA | F0 | N_ARNG | D_ARNG |
|---|---|---|---|---|---|---|
| slow | 00.45 Hz | .0014 | −.9972 | 2.0 Hz | .0062 | −.9876 |
| medium | 02.50 Hz | .0078 | −.9844 | 8.0 Hz | .0245 | −.9510 |
| fast | 30.00 Hz | .08615 | −.8277 | 30.00 Hz | .08615 | −.8277 |

As can be seen from an inspection of TABLE I above, the measurement filter for the second RMS converter 5 and the auto-range filter for the third RMS converter 10 each have different characteristics, depending upon the user's instructions concerning lowest measurable frequency and desired settling time. The result of these instructions is a value of SLOW, MEDIUM or FAST for a variable called FILTER_SPEED. There now follows a description of the properties of the filters for the different values of FILTER_SPEED.

When FILTER_SPEED is set to SLOW, each pole of the measurement filter has a 3 dB point at 0.45 Hz. The filter settles to 0.01% in five seconds. Each pole of the auto-range filter has a 3 dB point at 2.0 Hz, and that filter settles to within 5% in 0.39 sec and to within 1% in 53 sec. (The DC blocking compensation pre-emphasis filter, whose properties are yet to be discussed, settles to 0.001% in 2.5 sec.)

When FILTER_SPEED is set to MEDIUM, each pole of the measurement filter has a 3 dB point at 2.5 Hz. The filter settles to 01% in one second. Each pole of the auto-range filter has a 3 dB point at 8 Hz, and that filter settles to within 5% in 0.1 sec and to within 1% in 0.13 sec. (DC blocking compensation is not implemented when filter speed is set to MEDIUM).

When FILTER_SPEED is set to HIGH, each pole of the measurement filter has a 3 dB point at 30 Hz. The filter settles to 0.01% in 0.9 sec. For this mode of operation the auto-range filter is identical to the measurement filter. (DC blocking compensation is not implemented when FILTER_SPEED is set to HIGH).

We turn now to the DC blocking compensation accomplished by lines 4-6 and 11-19. As a place to begin, refer now to FIG. 5, wherein is shown a more detailed block diagram of the input coupling network 3. It will be understood that while what is shown is a particular preferred embodiment used in the HP 34401A Multimeter, it is merely illustrative, and that other applications of DC blocking compensation for RMS voltmeters may incorporate different DC blocking arrangements.

Figure 5:
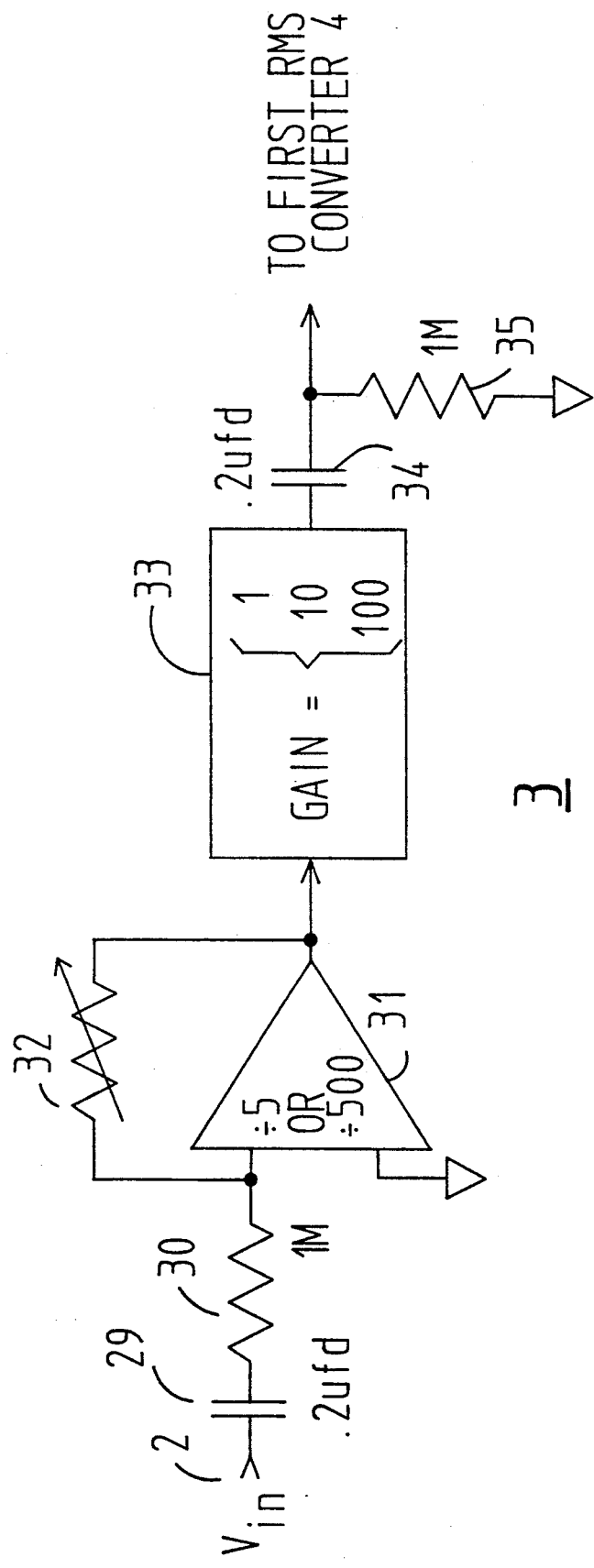
FIG. 5 is a more detailed block diagram of a particular instance of the input coupling network 3 of FIGS. 1 and 2.

In FIG. 5 the applied input voltage $V_{in}$ 2 is coupled to an input coupling capacitor 29, in series with an input resistor 30. Input resistor 30 is in turn coupled to an input attenuator/impedance converter 31 whose function is (1) to reduce the value of the applied $V_{in}$ either by a factor of five or a factor of five hundred, depending upon the value of feedback network 32, and (2) to drive gain stage 33. Gain stage 33 has a selectable gains of unity, ten and one hundred. In a preferred embodiment elements 31, 32 and 33 are controlled by the auto-range controller 12 of FIG. 2. The output of gain stage 33 is coupled through an output coupling capacitor 34 and developed across an output resistor 35, from whence it is applied to the first RMS converter 4.

Attenuator 31 and gain stage 33 are DC coupled, so the circuit of FIG. 5 has an AC frequency response of a two pole high pass filter. It is this reluctance to pass low frequencies that engenders the need for DC blocking compensation. The error produced in the reading of the preferred embodiment by the particular input coupling network 3 shown in FIG. 5 has the form:

$$\% \text{ ERROR} = 100\{[1/(1+.72/F)] - 1\} \quad (1)$$

The minus one in eq. (1) above develops the error by subtracting from the actual respons (the thing in the brackets []) the ideal response of unity gain. The multiplication by one hundred converts the fractional result of the subtraction to a percentage.

Figure 6:
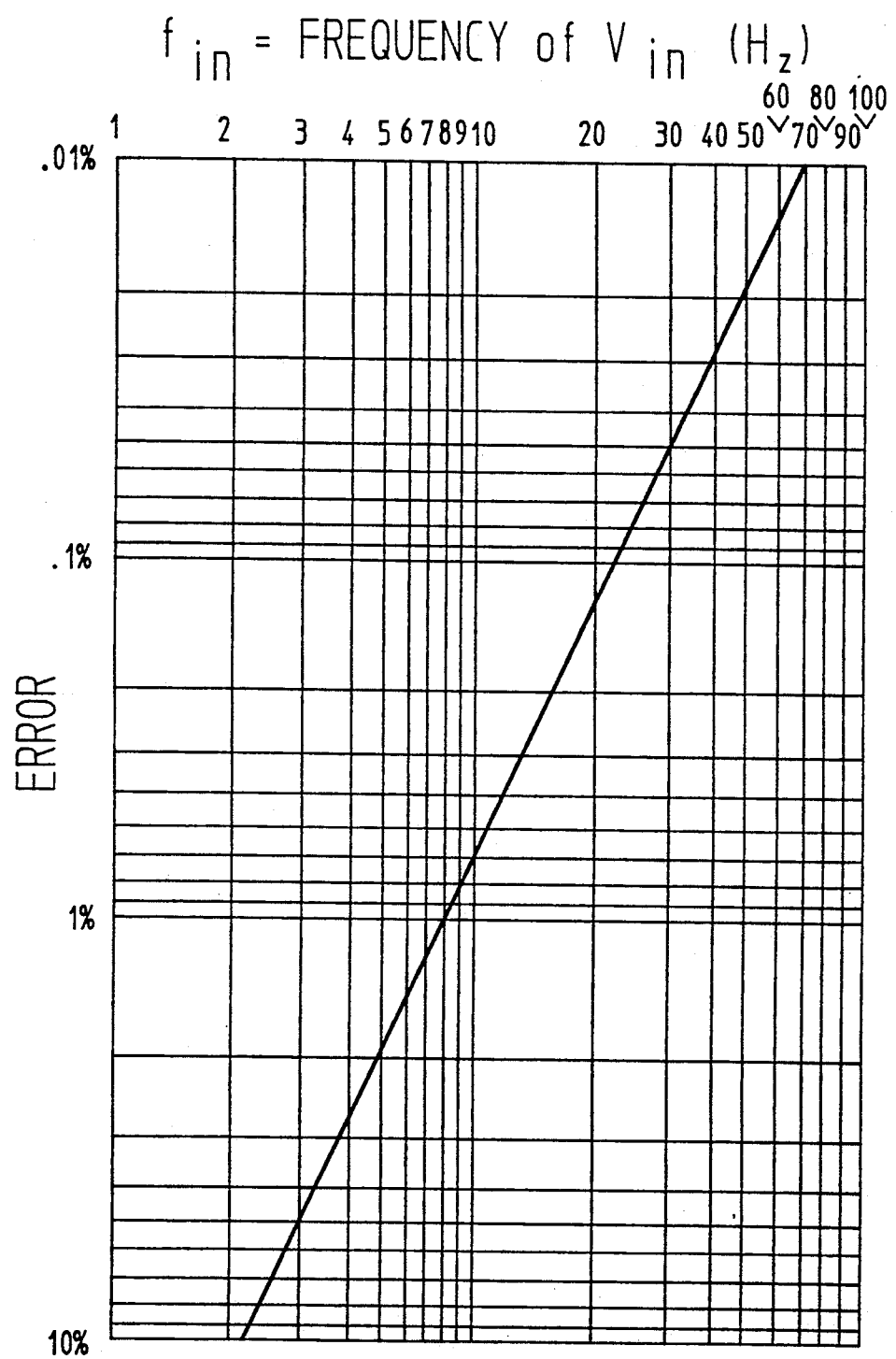
FIG. 6 is a graph showing as a function of frequency the error in the reading of the RMS voltmeter 1/9 of FIG. 1/2 and which is attributable to the presence of DC blocking in the input coupling network 3.

FIG. 6 is a graph of the error peroentaqe produced by eq. (1).

To demonstrate how the DC blocking compensation operates, note that the output of the second RMS converter 5 may be represented as in eq. (2) below:

$$\text{ROOT} = [(\text{DCOUT}_1)^2 + (\text{ACOUT}_1)^2]^{\frac{1}{2}} \quad (2)$$

[NOTE: $\text{DCOUT}_1$ is the DC output component of the first RMS converter 4; and $\text{ACOUT}_1$ is the AC output component of the First RMS converter 4. For sine waves the frequency of $\text{ACOUT}_1 = 2*f_{in}$.]

Without correction ROOT is in error at low frequencies because the input coupling network 3 reduces the amplitude of the signal reaching the first RMS converter 4. The error appears in both the $\text{DCOUT}_1$ and $\text{ACOUT}_1$ terms in eq. (2) above, and for each term is a function of frequency f (according to the nature of the DC blocking) and of how the first RMS converter 4 divides its output between $\text{DCOUT}_1$ and $\text{ACOUT}_1$. Exact individual compensation for the two terms $\text{DCOUT}_1$ and $\text{ACOUT}_1$ is not needed, if a function G(f) can be found that will adjust one of them such that the sum whose square root is being taken is correct down to some lower frequency of interest. G(f) is, of course, the transfer function of the pre-emphasis filter 24 of FIG. 4.

Since once given a particular first RMS converter 4 and a particular input coupling network 3 the transfer function of the pre-emphasis filter 24 reduces to just a function of frequency f, and since that frequency f represents itself intrinsically in $\text{ACOUT}_1$ and is absent from $\text{DCOUT}_1$, it is productive to enquire if a G(f) can be found for $\text{ACOUT}_1$, and let $\text{DCOUT}_1$ alone. Such a G(f) can indeed be found.

Actually, if the frequency of the applied $V_{in}$ is $f_{in}$, then the frequency of $\text{ACOUT}_1$ is $2*f_{in}$. This arises from the "rectification" performed by any RMS converter, since its output involves production of the absolute value of the input. This is similar to the generation of 120 Hz ripple by a full wave bridge rectifier operated at a 60 Hz power line frequency.

FIG. 7 is a graph of the frequency response of a particular pre-emphasis filter 24 used in the preferred embodiment practiced in the HP 34401A Multimeter. Note that the abscissa is $2*f_{in}$. By means of an analysis that is explained below, it is possible to find a function of frequency that will correct almost exactly for DC blocking error of FIG. 6. The correction is not truly exact since: (1) Some minor approximations in the derivation of $G(2*f_{in})$ may be convenient; and (2) The assumption is that $f_{in}$ is an undistorted sinusoid. Just as do average responding AC voltmeters, $G(2*f_{in})$ deviates from the ideal in the presence of arbitrarily related multiple frequencies (i.e., complex waveforms or distorted sine waves).

Such an almost exactly correct function of frequency is neither practical nor desirable, anyway, as a moments reflection along the lines below will confirm. Instead, the almost exact function is "adjusted" to render it more practical and realizable, without compromising its effectiveness. The $G(2*f_{in})$ we seek is such an adjusted function, and the graph of FIG. 7 is of such a $G(2*f_{in})$.

Increasing capacitive reactance as frequency decreases is the basic reason for the DC blocking error. The increase is without bound as frequency decreases; hence the error (as a percentage) increases without bound. This would imply that the gain of the compensatory pre-emphasis filter 24 would need to increase without bound with decreasing frequency. However, at the limiting case of a frequency of zero (DC) the pre-emphasis filter has to have a gain of unity, so that the DC component from the first RMS converter is not corrupted. That is, the correction function that works for all frequencies has a discontinuity at $f_{in} = 0$. If this difficulty were neglected, then the almost exact correction would appear as shown for the right-half portion of FIG. 7, with the dotted line 36 taking the place of the t-hand portion. That is, for frequencies of $\text{ACOUT}_1$ above $2*f_{in} = 100$ Hz the gain approaches some asymptote, which in the present case is the line GAIN = 1.143915. As the frequency of $\text{ACOUT}_1$ decreases the gain increases, and below $2*f_{in} = 2$ Hz simply keeps rising as shown by dotted line segment 36.

However, the following points should be borne in mind. No practical network can have an infinite gain, nor have a truly abrupt transition to unity gain at DC. What is more, any attempt to approximate such a thing will produce a pre-emphasis filter with an extremely long settling time, which is most undesirable.

Instead, use is made of the fact that the voltmeter is only specified for use down to some lower frequency limit, say, $f_{in} = 3$ Hz. It then no longer matters what the gain of the pre-emphasis filter 24 is below, say, $2*f_{in} = 4$ Hz, so long as it is indeed unity when the frequency gets close to zero (DC). The exact $G(2*f_{in})$ is then adjusted by the addition of inverse poles and inverse zeros to abort the increase in gain at frequency of one hertz for $\text{ACOUT}_1$, roll it off quickly until at a frequency of $2*f_{in} = 186$ Hz it begins to asymptotically approach unity.

An inspection of the graph of FIG. 7 reveals that the gain of the pre-emphasis filter 24 does not return to unity as frequency increases. Instead, it asymptotically approaches some limiting value, which in the present case is a gain of 1.1439. The reason for this is because the term $\text{ACOUT}_1$ in eq. (2) never quite goes to zero as frequency increases. So, at ever higher frequencies there is an ever decreasing $\text{ACOUT}_1$ term from the first RMS converter that is being adjusted by a small amount. Above about a frequency of one hundred hertz for $\text{ACOUT}_1$ this effect is negligible.

Here now is how the gain funotion of the pre-emphasis filter 24 is found. Recall that a voltage of $V_{in}$ is applied to the voltmeter. Let $V_{in}$ be a sine wave of frequency $f_{in}$. The applied $V_{in}$ goes through the DC block of the input coupling network 3. Let us call what comes out (and which is applied to the first RMS converter 4) $V_{wrong}$. Of course, $V_{wrong}$ is too low in amplitude, owing to the effect of the capacitive reactance of the DC blocking. The first RMS converter 4 then produces DCOUT$_1$ and ACOUT$_1$ which are each in error (too low) by some amount.

Now, the actual value of Vwrong depends not just on f$_{in}$, but also on the topology of the DC block itself. FIG. 5 shows the particular DC blocking topology used in the preferred embodiment. It consists of two cascaded RC poles (29, 30 and 34, 35). Those familiar with the analysis of AC networks will recognize that eq. (3) below describes V$_{wrong}$ in terms of V$_{in}$ and f$_{in}$. (In this analysis it is convenient to ignore the attenuation of elements 31/32 and the gain of element 33. They don't vary with f$_{in}$ and are constant for any particular measurement scenario.)

$$V_{wrong} = V_{in}/[1 + (f_o/f_{in})^2] \quad (3)$$

In eq. (3) above f$_o$ is the frequency where the capacitive reactance of the capacitors 29/34 equals the resistance of the resistors 30/35. Note that the form of eq. (3) fits the topology of FIG. 5; if the topology were different (different number of poles, poles of unequal frequency or the presence of inductors) the form of eq. (3) would change accordingly. The reader is reminded that the various forms are cataloged and explained in text books on AC network analysis.

We also take eq. (4) below as a given:

$$ACOUT_1 = C*V_{wrong}/[1 + (f_{in}/f_1)^2]^{\frac{1}{2}} \quad (4)$$

NOTE: $C = [1 - 8/pi^2]^{\frac{1}{2}}$

The following remarks apply to eq. (4). First, the form of the equation itself is dependent upon the nature of the RMS converter it describes Eq. (4) pertains specifically to the first RMS converter 4, and its general form was arrived at by a conventional analysis of what goes on inside that converter. Other types of RMS converters may have descriptive equations of differing forms. C is simply a constant produced by a convenient collecting of terms in that analysis. The term f$_1$ is dependent upon the time constant of the RMS converter being described (which in this case is the first RMS converter 4), and may be found empirically, if need be.

Now, eq. (5) below may be simply a rearrangement of eq. (2) with V$_{wrong}$ substituted for ROOT. Eq's (2) and (5) both follow from the fact that they describe an RMS converter where the RMS value of the output of the converter equals the RMS value of the input.

$$DCOUT_1 = [V_{wrong}^2 - ACOUT_1^2]^{\frac{1}{2}} \quad (5)$$

Eq. (5) is useful for the following reason. Earlier it was said that the DC blocking error disturbed both ACOUT$_1$ and DCOUT$_1$. The plan is to "fix" ACOUT$_1$, and we have expressions for ACOUT$_1$ in terms of V$_{wrong}$ and for V$_{wrong}$ in terms of V$_{in}$ and f$_{in}$. Thus, eq. (5) allows us to substitute things we know for DCOUT$_1$; this eliminates DCOUT$_1$ from an equation (below) that we can then solve for the fix [which is G(2*f$_{in}$)].

Recall that ROOT of eq. (2) is in error at low frequencies. Let us suppose that a G(2*f$_{in}$) exists such that:

$$GOODRMS = \{DCOUT_1^2 + [G(2*f_{in}) * ACOUT_1]^2\}^{\frac{1}{2}} = V_{in} \quad (6)$$

Now substitute for DCOUT$_1$ (according to eq. (5)) and solve the equation formed by the middle and right-hand members of eq. (6) above for G(2*f$_{in}$). Mercifully, and for the sake of brevity, that demonstration has been omitted. Some minor simplifying approximations may be employed to produce the following:

$$G(2*f_{in}) = K_1 * \{1 + [K_2/(2*f_{in})]^2\}^{\frac{1}{2}} \quad (7)$$

where: $K_1 = \{1 + [8*f_o^2/(C*F_1)^2]\}^{\frac{1}{2}}$ and $K_2 = (8^{\frac{1}{2}} * f_o/(C*K_1)$ The G(2*f$_{in}$) in eq. (7) above, if used as the basis for the pre-emphasis filter 24 would correspond to the almost exact but impractical compensation associated with the dotted line segment 36 of FIG. 7, and discussed in connection with that Figure. Instead, the equation for such a digital filter (for the pre-emphasis filter 24) is modified to roll it off (again, as described in connection with FIG. 7). The implementation of that modified filter is what is shown in the pseudo-code listing above.

I claim:

1. An RMS meter comprising:
    an RMS converter having a first time constant, having an input for receiving an applied signal whose RMS value is to be measured, and having an output for producing a first signal indicative of the RMS value of the applied signal and which first signal is mixture of AC and DC components according to the relationship between the first time constant and the frequency components of the applied signal;
    first RMS conversion means for measuring the AC and DC components of the first signal, the RMS conversion means having a second time constant at least as long as the first time constant, having an input coupled to the output of the RMS converter, and having an output at which appears a DC value proportional to the RMS value of the applied signal; and
    means, coupled to the output of the first RMS conversion means, for indicating the RMS value of the applied signal.

2. An RMS meter as in claim 1 wherein the RMS converter comprises an analog RMS converter and the first RMS conversion means comprises an analog to digital converter coupled to digital processing means for taking the square root of the mean of the squares of outputs of the analog to digital converter.

3. An RMS meter as in claim 2 wherein the digital processing means implements a first digital filter that has a time constant and that finds the mean of the squares of outputs produced by the digital to analog converter, and wherein the time constant of the first digital filter is the second time constant, and further wherein the second time constant is adjustable.

4. An RMS meter as in claim 2 further comprising an input coupling means, located between the applied signal and the input of the RMS converter, for blocking any DC component in the applied signal, and wherein the first RMS conversion means further comprises a pre-emphasis filter means for altering as a function of frequency the amplitude of the AC component before it is squared by the digital processing means.

5. An RMS meter as in claim 2 further comprising auto-ranging means coupled between the applied signal and the input of the RMS converter, the auto-ranging means for determining a range of operation for the RMS meter, and the RMS meter also further comprising a second RMS conversion means having an input coupled to the output of the analog to digital converter and having an output coupled to the auto-ranging means, the second RMS conversion means being for measuring the AC and DC components of the first signal and supplying the auto-ranging means with an indication of the RMS value of the applied signal.

6. An RMS meter as in claim 5 wherein the second RMS conversion means comprises a second digital filter implemented by the digital processing means, and wherein the digital processing means further finds the square root of the mean of the squares of values produced by the second digital filter.

7. An RMS meter as in claim 6 wherein the first and second digital filters each have respective settling times, and further wherein the settling time of the second digital filter is less than the settling time of the first digital filter.

8. An RMS meter comprising:
input coupling means for receiving at an input an applied signal and for producing at an output a scaled replica of the applied signal in accordance with range control signal applied to the input coupling means;
a first RMS conversion means for receiving at an input the scaled replica of the applied signal and for producing at an output a signal whose RMS value is proportional to the applied signal;
second RMS conversion, coupled to the output of the first RMS conversion means, for producing at an output a DC signal indicative of the RMS value of the applied signal;
output means, coupled to the output of the second RMS conversion means, for registering the RMS value of the applied signal;
third RMS conversion means, coupled to the output of the first RMS conversion means, for producing at an output a DC signal indicative of the RMS value of the applied signal; and
range control means, coupled to the output of the third RMS conversion means, for producing at an output that is coupled to the input coupling means the range control signal in accordance with the amplitude of the output of the third RMS conversion means.

9. An RMS meter as in claim 8 wherein each of the first, second and third RMS conversion means' have respective associated time constants, and further wherein the time constant of the third RMS conversion means is equal to or longer than that of the first RMS conversion means and less than or equal to that of the second RMS conversion means.

10. An RMS meter as in claim 8 wherein the first RMS conversion means is an analog RMS converter and the second and third RMS conversion means' comprise an analog to digital converter coupled to a processing means implementing first and second programs whose operations include squaring, averaging and taking a square root.

11. A method of compensating the roll-off in low frequency response of an RMS meter having an AC coupled input, the method comprising the steps of:
converting an applied signal passing through the AC coupled input into AC and DC components whose combined RMS value is proportional to the RMS value of the applied signal;
emphasizing the AC components according to a function of frequency; and
finding the RMS value of the DC component and the emphasized AC component.

12. A method as in claim 11 wherein the converting step comprises the step of coupling the applied signal to an analog RMS converter, wherein the emphasizing step comprises the steps of sampling the AC and DC components with an analog to digital converter and filtering the samples with a pre-emphasis digital filter implemented by a processor, and wherein the finding step comprises the steps of squaring the pre-emphasized samples, averaging the squared pre-emphasized samples, and taking the square root of the average, the squaring, averaging and taking of the square root also implemented by the processor.

13. A method of measuring the RMS value of a signal, the method comprising the steps of:
applying a signal to a first RMS converter having a first time constant and having the property that the RMS value of its output is proportional to the RMS value of its input;
measuring the RMS values of AC and DC components in the output of the first RMS converter with a second RMS converter having a second time constant at least as long as the first time constant; and
combining the measured RMS values of the AC and DC components.

* * * * *